(12) United States Patent
Wallace et al.

(10) Patent No.: US 7,569,310 B2
(45) Date of Patent: Aug. 4, 2009

(54) SUB-RESOLUTION ASSIST FEATURES FOR PHOTOLITHOGRAPHY WITH TRIM ENDS

(75) Inventors: Charles H. Wallace, Portland, OR (US); Chiou-hung Jang, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 601 days.

(21) Appl. No.: 11/296,983

(22) Filed: Dec. 7, 2005

(65) Prior Publication Data

US 2007/0128525 A1 Jun. 7, 2007

(51) Int. Cl.
 G03F 1/00 (2006.01)
 H01L 21/00 (2006.01)
 G06F 17/50 (2006.01)
(52) U.S. Cl. ............... 430/5; 430/311; 716/20; 716/21
(58) Field of Classification Search ............ 430/5, 430/311; 716/19, 20, 21
 See application file for complete search history.

(56) References Cited

U.S. PATENT DOCUMENTS

| 6,383,691 | B1 * | 5/2002 | Seitz et al. | 430/5 |
| 2003/0208742 | A1 * | 11/2003 | LaCour | 716/21 |
| 2005/0202321 | A1 * | 9/2005 | Gordon et al. | 430/5 |
| 2006/0046160 | A1 * | 3/2006 | Wallace et al. | 430/5 |

* cited by examiner

*Primary Examiner*—Mark F Huff
*Assistant Examiner*—Jonathan Jelsma
(74) *Attorney, Agent, or Firm*—Blakely, Sokoloff, Taylor & Zafman LLP

(57) ABSTRACT

Sub-resolution assist features with trim ends are described for use in photolithography. A photolithography mask with elongated features is synthesized. A sub-resolution assist feature is applied to an end-to-end gap between the elongated features. Trim is applied to the ends of the sub-resolution assist feature, the trim connecting the sub-resolution assist feature to an end of a main feature, the trim having a narrower width than the remaining portion of the sub-resolution assist feature and the synthesized photolithography mask is modified to include the sub-resolution assist feature and trim.

18 Claims, 6 Drawing Sheets

FIG. 5A
Drawn

FIG. 5B
OPC correction w SRAFs

FIG. 5C
Printed on wafer

SUB-RESOLUTION ASSIST FEATURES FOR PHOTOLITHOGRAPHY WITH TRIM ENDS

FIELD

The present description relates to semiconductor photolithography and, in particular, to modifying the sizes of sub-resolution assist features.

BACKGROUND

In the production of semiconductors, such as memory, processors, and controllers, among others, a mask is used. The mask is placed over a semiconductor wafer to expose or shield different portions of the wafer from light, or some other element. The exposed wafer is then processed with etching, deposition and other processes to produce the features of the various semiconductors in the wafer that make up the finished product. The masks are designed using computer design programs that derive an aerial view or image of the wafer based on the electronic circuitry that is to be built on the wafer. The mask is designed to produce this aerial image on the wafer based on using a particular set of photolithography equipment. In other words the mask must be designed so that when a particular wavelength of light at a particular distance is directed to a wafer through a particular set of optics and the mask, the desired pattern will be illuminated with the desired intensity on the wafer.

The pattern on the mask may be very complex and finely detailed. In some systems, a mask is designed with a matrix of pixels in columns and rows that illuminate a wafer that has an area of about one square centimeter. The mask may be four or more times that size and reduction optics are used to reduce the mask image down to the size of the wafer. For a 193 nm light source, each pixel may be about 100 nm across so that the mask may have billions of pixels. Each pixel is either a transparent spot on the mask (1), an opaque spot on the mask (0), or a transparent spot that reverses the phase of the light passing through (−1). The use of three different values (+1, 0, −1) allows for greater control over the diffractive effects through the mask.

In order to enhance the accuracy and the resolution of the pattern that results on the wafer. A variety of different optimization techniques are typically applied to the mask. One such technique is to add sub-resolution assist features (SRAF) or scattering bars to a mask. These are usually small features in the form of parallel lines or spaces that are smaller than the resolution limit of the imaging system. In other words, the features are too small to be printed on the wafer through the lens but they influence the lithographic behavior of the larger features that they are near. For example, SRAFs in the form of parallel lines running along either side of a solid line improves the focus of the solid line.

SRAFs can be used to ensure that features will be printed correctly on the wafer even as the parameters of the printing process (focus, intensity, chemistry, wafer composition, etc.) vary through their anticipated range. (The combination of these variations of the parameters of the printing process are sometimes referred to as the process window.) SRAFs have been combined with optical proximity correction (OPC), off-axis illumination (OAI), attenuated phase shifted mask (APSM) enhanced lithography, embedded phase shifted mask (EPSM) lithography, and other techniques for even more accurate photolithography.

Even with all of the currently available techniques, it is still difficult to pattern structures that are very close together. When structures on the wafer are to be printed very close together, the mask error enhancement factor (MEEF or mask error factor MEF) tends to increase which in turn leads to high variations in the critical dimension (CD) for the process across the printed area. The MEEF represents how much the size of a feature printed on a mask changes in response to a change in the mask. A MEEF of 1.0 indicates that a change in the mask causes a proportional change in the final printed wafer. In other words, moving a line 4 micrometers in the mask will move the same line 1 micrometer in the printed wafer, if the lithography optics reduces the mask image on the wafer by a factor of four. When features become small enough to be near the resolution limit of the photolithography system, the MEEF increases dramatically. This means that a small change on the mask produces a very large change on the printed wafer. This makes it difficult to precisely control feature sizes. The mask design is also made more complex because different features on the same mask will have different MEEFs.

The MEEF can be reduced by using a second mask and printing some features using one mask and other features using another mask. However, this doubles the time and expense of performing the exposure. The MEEF can also be reduced by maintaining a distance between all SRAFs and between SRAFs and printed features. Such a keepaway distance, however, reduces the effectiveness of SRAFs and also prevents features from being close together

BRIEF DESCRIPTION OF THE DRAWINGS

Embodiments of the present invention may be understood more fully from the detailed description given below and from the accompanying drawings of various embodiments of the invention. The drawings, however, should not be taken to be limiting, but are for explanation and understanding only.

DETAILED DESCRIPTION

For end-to-end structures, the size of sub-resolution assist features (SRAFs) may be reduced to lower the mask error enhancement factor (MEEF), without sacrificing the process window enhancement of the bridging SRAFs. In one embodiment, the SRAFS bridging two adjacent end-to-end structures are smaller than the SRAFs surrounding a feature.

Figure 1:
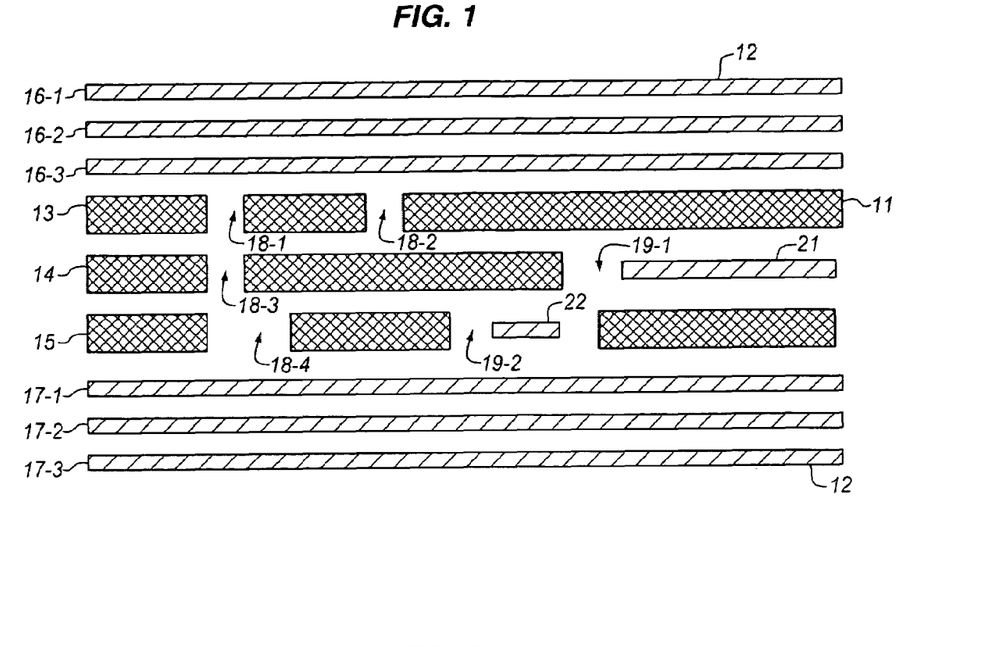
FIG. 1 is a diagram of a portion of a wafer showing main features and SRAFs applying rules known in the art.

FIG. 1 shows in a simplified diagram, a small portion of a conventional mask with main features 11 and SRAF 12. The features of FIG. 1 are shown as examples of possible features and the shapes are simplified. Embodiments of the invention may be applied to many other types and shapes of features and to structures that are simpler and more complex than those shown. In FIG. 1, the main features are parallel line segments aligned into three adjacent horizontal rows 13, 14, 15. SRAF is applied above and below, the adjacent rows. So, for example above the top row 13, three parallel adjacent horizontal SRAF lines 16-1, 16-2, 16-3 are applied to the mask. Similarly three parallel, adjacent, horizontal SRAF lines 17-1, 17-2, 17-3 are applied below the bottom row of main features 15.

The mask is further enhanced by SRAF features applied to end-to-end regions between the main feature line segments. FIG. 1 shows six end-to-end gap regions between main features. Four of these gap regions 18-1, 18-2, 18-3, 18-4 are too short to allow an SRAF feature to be applied. This is based on a design rule for a keepaway distance between features. The keepaway distance is applied to the distances between main features, the distances between SRAF features and the distances between main features and SRAF features.

The distance is reflected in FIG. 1 in the horizontal distance between the top row of main features and the first SRAF line as well as in the distance between the bottom row of main features and the closest SRAF lines. The keepaway distance is further reflected in the distance between each row of main features. While the main features are far enough apart to satisfy the keepaway distance, there is not enough room in four of the gaps to also add an SRAF. The appropriate keepaway distance for any particular application will depend on the particular wafer, photolithography process and equipment. The smallest keepaway distance may be determined by preparing test wafers using the intended process and observing results through the process window.

On the other hand, FIG. 1 shows two end-to-end regions 19-1, 19-2 that are large enough to allow SRAF to be inserted between the main features in that row. The first SRAF 21, inserted in the larger of the two gap regions 19-1, is spaced apart from the closest main feature by the keepaway distance and extends through the left hand extent of the diagram perhaps until it reaches another main feature. The particular length of the SRAF will be determined using a variety of different design rules. The second SRAF 22 is inserted into the smaller of the two end-to-end gaps 19-2 and is limited on both sides by the keepaway distance to the adjacent main features.

In both cases, the SRAFs are narrower than the main features but parallel to and aligned with the main features. In the example of FIG. 1, all of the main features are collinear and aligned in a grid. The main features may be considered to be linear in that they are mostly elongated (longer than they are wide) with substantially parallel sides. The SRAF features are collinear with the main features and aligned to the same grid. Each of the elongated main features may also be considered as having a centerline along its length. The SRAFs of FIG. 1 also have a centerline and the centerlines of the SRAFs are aligned with the centerlines of the main features on either end.

The size of the SRAFs in FIG. 1 may be determined conventionally based on the photolithography process and the size of the various main features. Typically, the SRAFs are sized so as to be below the resolution limit of the process, yet large enough to improve the resolution of the adjacent main features. SRAF sizing may be determined using a test wafer with SRAF features of varying widths and then observing the results. Typically, the largest feature that does not print though all process variations is the best size to use.

As can be seen in FIG. 1, conventional design rules limit how much SRAF may be used. If the keepaway distance is violated, then an increase in the mask error enhancement factor (MEEF) can be expected that will reduce the overall benefit that SRAF may offer.

Figure 2:
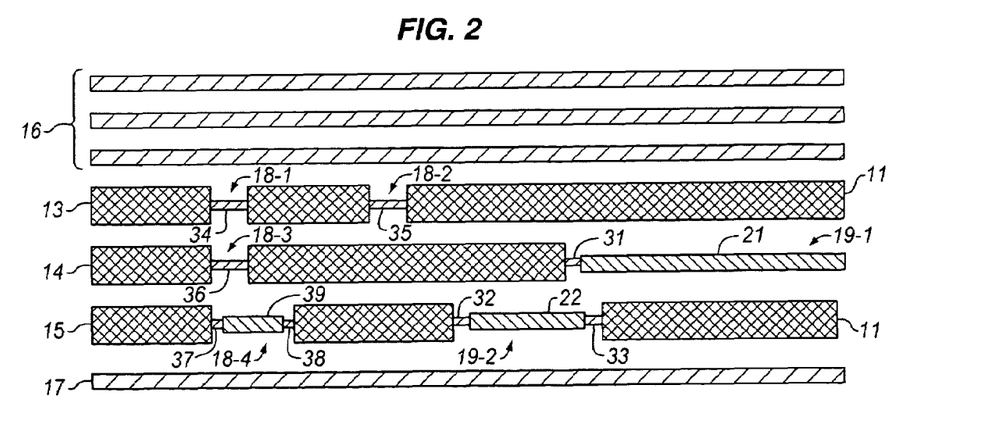
FIG. 2 is a diagram of the portion of the wafer of FIG. 1 showing the application of SRAF using different sizes according to an embodiment of the present invention.

FIG. 2 shows how SRAFs may be reduced in size and connected to the structures of main features. The size reduction reduces MEEF in end-to-end regions without a reduction of the process window. FIG. 2 is a diagram of the same simplified portion of a mask with the same main features 11 in the same three horizontal rows 13, 14, 15. In addition, the same SRAFs 12 are applied to the mask to produce the same resolution enhancements that are produced in the diagram of FIG. 1. However, in FIG. 2, the use of SRAF has been increased by using SRAFs of a significantly smaller size.

The smaller size allows the keepaway distance to be violated without increasing MEEF. In the example of FIG. 2, the reduced size SRAF has been designed so that the SRAFs may abut the main features. In other words, the keepaway distance for the smaller SRAFs has been reduced to zero. The particular change in keepaway distance may be determined for any particular application in light of the SRAF size reduction and the parameters of the photolithography process.

In FIG. 2, the longer end-to-end SRAF 21 of FIG. 1, has been augmented with a short reduced-size SRAF 31 connecting the SRAF to the nearby main feature in the same row. Similarly, the shorter end-to-end SRAF in FIG. 1 has been augmented on both sides with reduced size SRAFs 32, 33 connecting the full-size SRAF to main features on both sides in the same row. The additional reduced-size SRAF segments may be viewed as trim attached to the larger SRAFs.

The elimination of the keepaway distance with the reduced size SRAFs allows SRAFs to be used in the gap regions where SRAF was not used in FIG. 1. As mentioned above, in four places the end-to-end distance between the main features was too small, based on the keepaway distance, in FIG. 1, so SRAF was not used. The gap was considered too small if it was too small to fit a SRAF. In other words, smaller than twice the keepaway distance plus the minimum size for an SRAF. With the elimination of the keepaway distance, this restriction is eliminated and reduced size SRAFs 34, 35, 36, 37, 38 may be added in all four of these gap regions 18-1, 18-2, 18-3, and 18-4.

The largest of the gap regions shows another benefit of the reduced size SRAFs. While a single segment of reduced size SRAF may be used similar to the SRAFs 34, 35, 36 shown in the other small gaps, the size of the SRAF may be increased as well. FIG. 2 shows a segment of full size SRAF 39 between the main features and two shorter segments of reduced size SRAF 37, 38 (or trim) to connect the full size SRAF portion to the adjacent main features. The relative sizes of the portions may be varied to suit particular applications, design rules and gap regions. The SRAFs in the fourth small gap 18-4 illustrate another benefit of the reduced size SRAF. It allows the keepaway distance for the full size SRAF to be reduced wherever the reduced size SRAF is used. This shorter keepaway distance for the full size SRAF allows a short piece of full size SRAF to be applied to this gap region, even though no SRAF was allowed under the design rules for FIG. 1.

The sizes of the SRAFs may be carefully tuned based on the local proximity of neighboring features. The optimal SRAF position and sizing may be determined based on at least three criteria. First, the SRAF may be selected to be small enough that the image intensity created from the SRAF does not create a pattern in the photoresist during exposure. In one example, the threshold intensity for the SRAF needs to be less than or equal to about 70% of the target intensity of the main feature. The extra 30% margin ensures that no feature will be printed across process variations. Second, the SRAF may be selected to be large enough to improve the process window of an isolated feature so that it is close to that of the same size nested feature. In other words, SRAF is large enough to enhance the contrast of the aerial image of the main feature by some desired amount. Third, the addition of the SRAF should not significantly increase the mask error enhancement factor of the features or go beyond the resolution limits of the reticle manufacturing process. Additional criteria and design rules may be taken into consideration depending on the particular application.

In order to improve the use of SRAFs in end-to-end regions, a useful size range for SRAFs may be established based for example, on the criteria mentioned above. For such a range, the lower limit of SRAF size may be set to the minimum size producible on the mask that still increases the aerial image contrast of the main features. The maximum size may be set by the highest image intensity that will not produce an image on the photoresist reduced by some margin, for example the 30% margin mentioned above. This minimum size may be used on all structures where the SRAF connects with the main features. This is shown by the SRAFs 34, 35, 36 in the smallest three gap regions. The minimum size minimizes the MEEF of the end-to-end regions. The maximum size SRAF may be attached in regimes where the end-to-end distance is greater than, for example, about 5 times the width of the main features. This is shown in FIG. 2 in the largest three gap regions 21, 22, 39. The minimum size SRAF may also be attached directly to the main feature for a period of about the line width and then immediately increased to the maximum value of the SRAF range.

The largest of the small gap regions 18-4 shows many of the advantages offered by the present invention. Adding a reduced size SRAF at the point where they connect to the main feature provides a significant reduction of MEEF. If the SRAFs are not connected to the main features or if the SRAF is removed completely from the end-to-end region as shown in FIG. 1, the MEEF may rise quickly and the smaller end-to-end dimensions may not be patterned as well or at all. In the intermediate sized gap region 18-4 of FIG. 2, resolution is enhanced and MEEF is kept under control.

In the example of FIG. 2, an end-to-end region is considered to be any two features that are closer than approximately 5 times their width. This particular parameter, as well as any other parameters mentioned above may be adapted to suit different applications, different processes and different dimensions. The example of FIGS. 1 and 2 is also provided with SRAFs and features on a continuous grid. This allows end-to-end regions to be lined up horizontally to simplify consideration of different size regions. However, the same approach may be applied to layouts in any shape or form in which two features are positioned at close proximity.

As mentioned above, the best sizes for SRAFs may be determined empirically, by exposing test wafers with different sized features and different sized SRAFs and then examining the results. Additional test portions of the wafer may be used to evaluate the impact of the SRAFs on MEEF. Different tests may be performed for different processes. The most suitable dimensions may vary with different types of wafers, different types of photo-resists, different types of scanners, different types of masks, different sizes and shapes for main features, different chemistry, timing, temperatures, etc. In one example using EPSM with 193 nm illumination and main features widths of about 80 nm, the large SRAF features may be about 50 nm wide and the trim ends about 20 nm wide.

Another approach to determining appropriate sizes for SRAFs is to use process simulation software. This type of software typically produces a simulated aerial image for a particular simulated wafer pattern and then estimates the resulting pattern that would be printed on a semiconductor wafer. Such software allows different size SRAFs to be analyzed with different main feature configurations. The simulation software may be used together with empirical results in different ways to determine optimal SRAF sizes.

Figure 3:
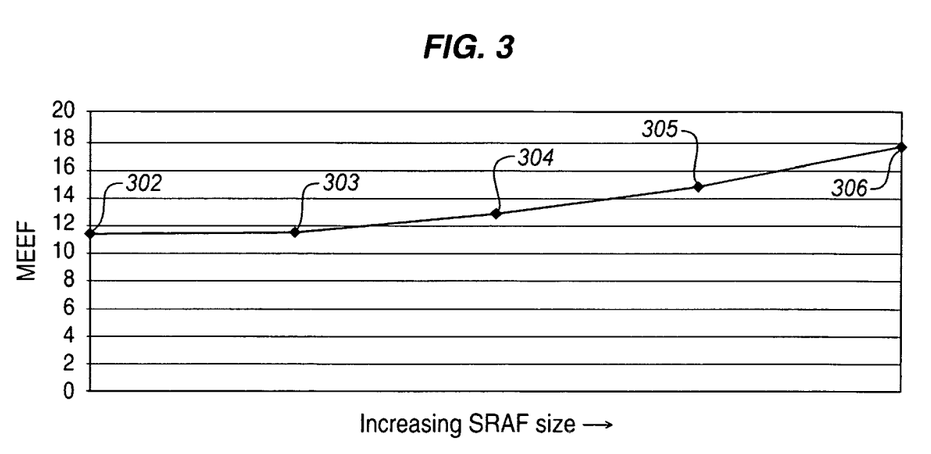
FIG. 3 is a chart comparing MEEF to SRAF size according to an experiment applying an embodiment of the present invention.

FIG. 3 is a graph showing example results based on such tests for a particular process. In FIG. 3, MEEF increases from 0-20 on the vertical axis. SRAF size increases along the horizontal axis. As shown in FIG. 3, SRAF size has no effect on MEEF within a particular range indicated as between points 302 and 303. Then, as the SRAFs increase in size, there is a corresponding increase in MEEF at point 304 and beyond. Since the resolution of the main features improves as the SRAF increases, a compromise may be made between main feature resolution and MEEF. As SRAF size increases to points 305 and 306, MEEF becomes as high as 18 and may be expected to increase still more with further increases in SRAF. At some point, SRAF size is so large that the feature is no longer sub-resolution, i.e. it will be printed on the photoresist. To minimize MEEF, a smaller size, such as that at point 303 may be selected.

Figure 4:
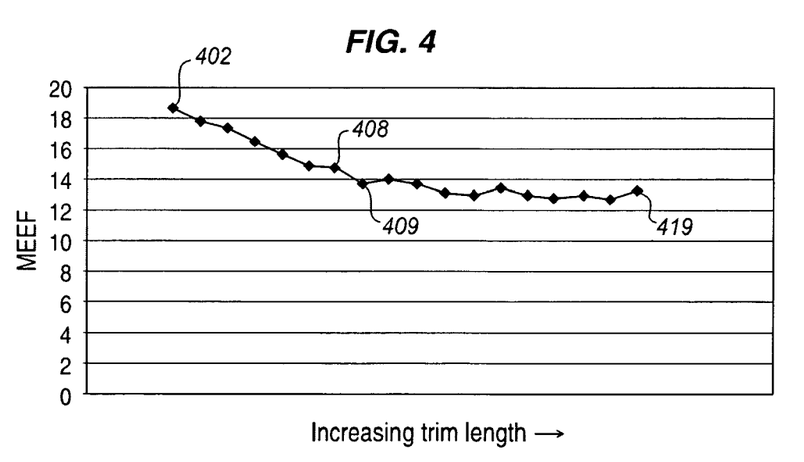
FIG. 4 is a chart comparing MEEF to SRAF trim length according to an experiment applying an embodiment of the present invention.

FIG. 4 is a graph showing example results based on test wafers for the same process as in FIG. 3. In FIG. 4, MEEF increases from 0 to 20 up the vertical axis. Trim length increases along the horizontal axis. The trim length refers to the length of a reduced size SRAF that bridges a gap between a main feature and a full-size SRAF. Trim is shown, for example in FIG. 2 as elements 31, 32, 33, 37, and 38. Viewed another way, the trim length corresponds to the distance between an end of a large size SRAF and the nearby end of a main feature. Increasing the trim length, increases this distance.

As shown at point 402, when the trim is very short, the MEEF is quite high, 19 in this example. This greatly increases the difficulty in producing a reliable mask. However with a much longer trim length at point 419, the MEEF is significantly reduced. In addition, the MEEF does not increase very much as the trim length is decreased to about point 409, staying around 14. However, if the trim length is made any shorter, MEEF begins to increase quickly. The next shortest trim length, measured at point 408, shows an increase in MEEF to 15. The MEEF then rises quickly up to the maximum value shown of 19 at point 402. Using such a set of measurements, an optimal trim length may be determined for any particular process. A trim length corresponding to point 408 will give the optimum SRAF benefit without increasing MEEF. This may be the best choice for many applications. In other applications, some increase in MEEF may be acceptable, so that a still shorter trim length may be used.

Figure 5A:
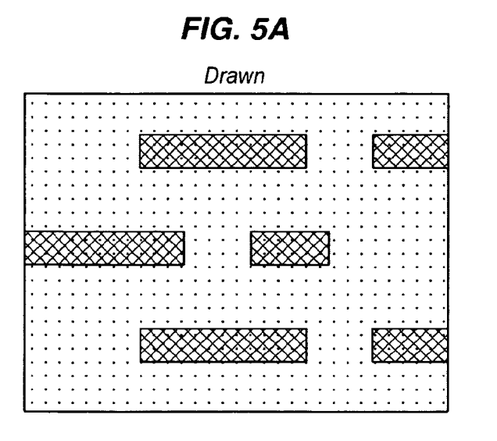
FIG. 5A is a diagram of a set of wafer features on a portion of an idealized mask.
Figure 5B:
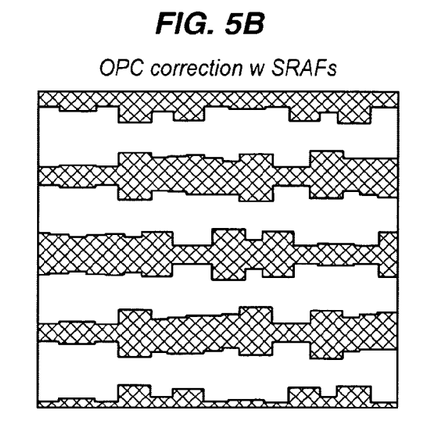
FIG. 5B is a diagram of the set of wafer features of FIG. 5A after applying SRAFs and OPC according to an embodiment of the present invention.
Figure 5C:
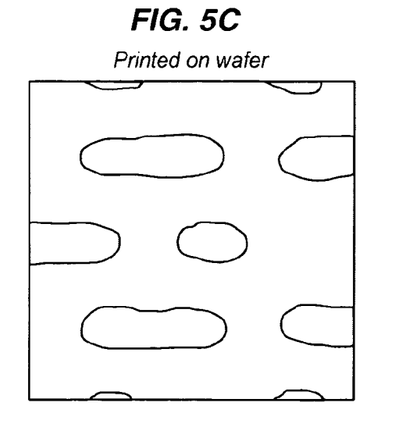
FIG. 5C is a diagram of a portion of a wafer printed in an experiment based on the mask of FIG. 5B.

FIGS. 5A, 5B, and 5C provide an indication of results that may be obtained using SRAF with trim as shown in FIG. 2. FIG. 5A shows the main features as they are drawn on the theoretical desired wafer. These shapes represent idealized shapes that may be impossible or difficult to create an a wafer. FIG. 5B shows the same features as they may be produced on a mask. The same features are still present, however, SRAF with trim has been applied to bridge the end-to-end gaps between the features. In addition, the features have been modified using OPC. Instead of being simple rectangles, the widths of the features are varied in order to improve how they will print using, e.g. hammerheads, dog-ears and other OPC features.

FIG. 5C shows an example of a portion of a printed wafer that may be obtained with the mask of FIG. 5B. The drawing of FIG. 5C is based on an actual image produced by a scanning electron microscope. FIG. 5C shows that the rectangular shapes of FIG. 5A are reproduced very well. In addition, the relative sizes of the features and the distances between them are also very similar to that of FIG. 5A. Pullback in the end-to-end regions has been virtually eliminated and the sides of the features maintain the spacing of the grid.

Figure 6:
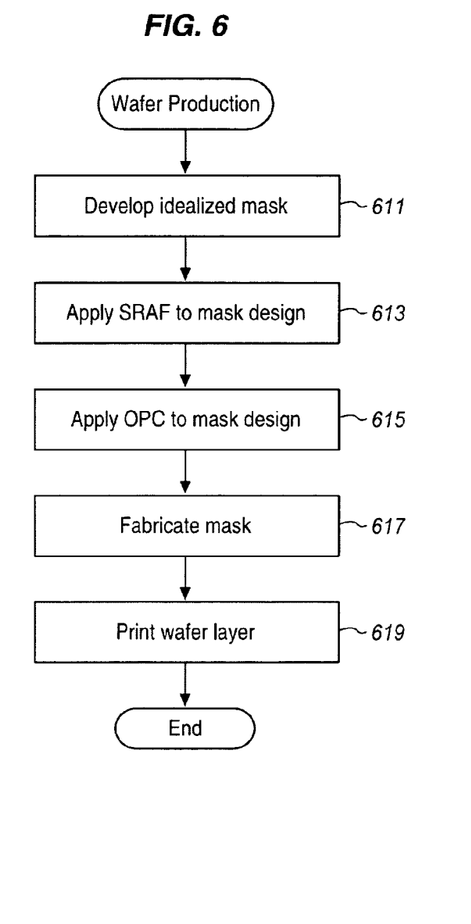
FIG. 6 shows an example of a wafer production process according to an embodiment of the present invention.

FIG. 6 shows an example of a wafer production process according to an embodiment of the invention. In FIG. 6, an idealized mask is developed at block 611. The idealized mask has all of the features that are desired to be printed on the wafer. Typically in such an idealized mask, the features have a shape that assumes that the printing accurately follow the shapes of the mask. However, the mask may already be optimized and adjusted according to any of a variety of different techniques. SRAFs are applied to the idealized mask design at block 613. An example of such an application of SRAFs is described below in association with FIG. 7. In one example, SRAFs are applied in differing sizes depending on the shape, size and proximity of the main features.

OPC is applied to the mask design at block 615. OPC may be applied before or after the SRAFs are applied or both. In one embodiment, the mask design is developed using iterations of the aerial image until the printed result is optimized. The iterations may apply different types or amounts of SRAFs and OPC. In one embodiment, the application of SRAFs is incorporated into the OPC process. Alternatively, different or additional mask enhancement or improvement processing may be used. OPC may be replaced with other techniques, depending on the particular application. At block 617 a real mask is fabricated based on the modified mask that results from the operations of block 615 and at block 619, a wafer is printed using photolithography and the fabricated mask. The wafer may be a semiconductor circuit, a micromachine or any other microelectronic device.

Figure 7:
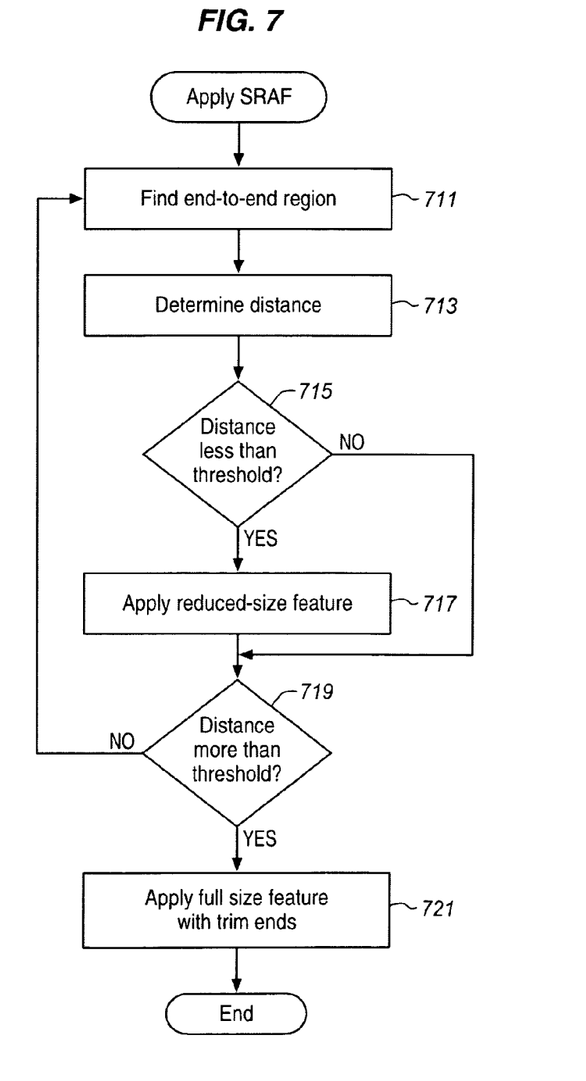
FIG. 7 shows an example of a process of applying a SRAF to a mask design according to an embodiment of the present invention.

FIG. 7 shows an example of a process of applying a SRAF to a mask design according to an embodiment of the invention. Such a process may be applied to block 613 of FIG. 6. Initially an end-to-end region between ends of two main features in the idealized mask is found at block 711. Such end-to-end regions are shown, for example in FIGS. 1 and 2. Selecting one such region the distance between the two ends is determined at block 713. While this example is presented in the context of elongated features in a grid with ends that are positioned near each other. The same technique may be applied to features of other shapes and features that are not in a grid.

At block 715, the end-to-end distance is compared to a threshold. If the distance is less than the threshold, then a reduced-size feature is applied at block 717. Such a reduced-size sub-resolution assist feature is shown for example in FIG. 2 at 34. On the other hand, at block 719, if the end-to-end distance is more than the threshold, then a full size feature with trim ends is applied to the gap region at block 721. Such a a full-size featured with trim ends is shown for example in FIG. 2 at 22, 32, 33.

In the examples above, two sizes of sub-resolution assist feature elements are shown and described. The difference in the two sizes is only in width. The wider size is maximized to the largest size that can be placed on a mask without actually printing the feature on a wafer. The smaller size is selected based on a compromise between size and MEEF. According to one principle of operation, the wider size is maximized and the rest of the end-to-end distance is filled in with the narrower size or trim ends. The length of the trim ends is selected again based on a compromise between length and MEEF. However, many variations are possible from the simple two-size approach.

In one embodiment, there are three widths of SRAF elements. The third width is intermediate in size between the narrow size and the maximized size and is used to transition between the two sizes. In other words, the intermediate length is placed between the wider section and the narrower section. This may allow for more accurate printing on the wafer and it may allow the narrower trim end to be shortened. Additional intermediate lengths may be added to further increase this effect. Alternatively, each SRAF element may be optimized to its particular location. While a set of predefined widths may be used, the widths need not be restricted to specific sizes.

In another embodiment, for certain mask fabrication technologies, the trim ends may instead be shaped with angled sides. These sides are farthest apart, for the greatest width where the trim end meets the large-size element of the SRAF and closest together, for the least width, where the trim end meets the main printed feature. Such a tapered design achieves a result similar to that of the intermediate width features but with a single tapered feature. The angle of the sides for any particular lithography process may be determined using simulation and experiment.

In another embodiment, there may be more different sizes of SRAF elements so that the size of the SRAF and the size of the trim ends may be optimized for different end-to-end gap sizes. The different sizes may be developed based on simulation and experiment. In such an embodiment, the end-to-end distances may be divided into different ranges and the size and shape of the SRAF to be inserted may be determined based on which range matches with a particular distance on the mask. In order to adapt the SRAF to the different sizes within a range the length of the widest portion of the SRAF shape may be adjusted to fit.

Figure 8:
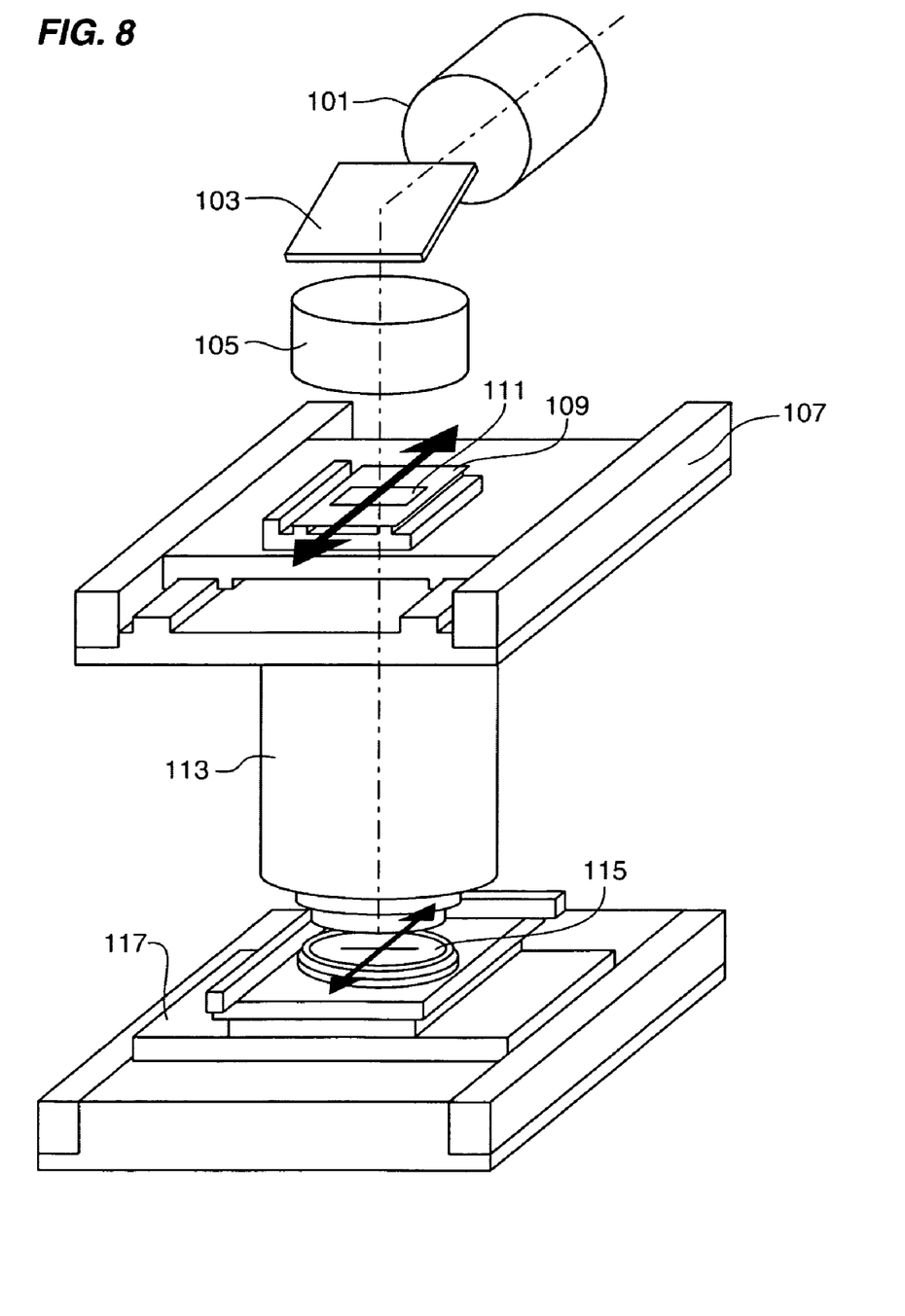
FIG. 8 is a diagram of a semiconductor fabrication device suitable for application to the present invention.

FIG. 8 shows a conventional semiconductor fabrication machine, in this case, a lens-scanning ArF Excimer Laser Stepper, that may be used to hold a mask or produce a wafer in accordance with embodiments of the present invention. The stepper may be enclosed in a sealed vacuum chamber (not shown) in which the pressure, temperature and environment may be precisely controlled. The stepper has an illumination system including a light source 101, such as an ArF excimer laser, a scanning mirror 103, and a lens system 105 to focus the laser light on the wafer. A reticle scanning stage 107 carries a reticle 109 which holds the mask 111. The light from the laser is transmitted onto the mask and the light transmitted through the mask is focused further by a projection lens with, for example, a four-fold reduction of the mask pattern onto the wafer 115.

The wafer is mounted to a wafer scanning stage 117. The reticle scanning stage and the wafer scanning stage are synchronized to move the reticle and the wafer together across the field of view of the laser. In one example, the reticle and wafer move across the laser light in a thin line, then the laser steps down and the reticle and wafer move across the laser in another thin line until the entire surface of the reticle and wafer have been exposed to the laser. Such a step and repeat scanning system allows a high intensity narrow beam light source to illuminate the entire surface of the wafer. The stepper is controlled by a station controller (not shown) which may control the starting, stopping and speed of the stepper as well as the temperature, pressure and chemical makeup of the ambient environment, among other factors. The stepper of FIG. 8 is an example of a fabrication device that may benefit from embodiments of the present invention. Embodiments of the invention may also be applied to many other photolithography systems.

The mask controls the size of each feature on the wafer. The mask design is made up of chrome metal lines, molybdenum silicide lines, or lines of some other material of different widths and shapes designed to create a particular pattern on the wafer. When OPC (Optical Proximity Correction) is applied to the mask, the mask is modified iteratively, primarily by modifying the widths of the metal lines and adding decorations to corners, until the photolithography model predicts that the final wafer will match the intended target design.

Figure 9:
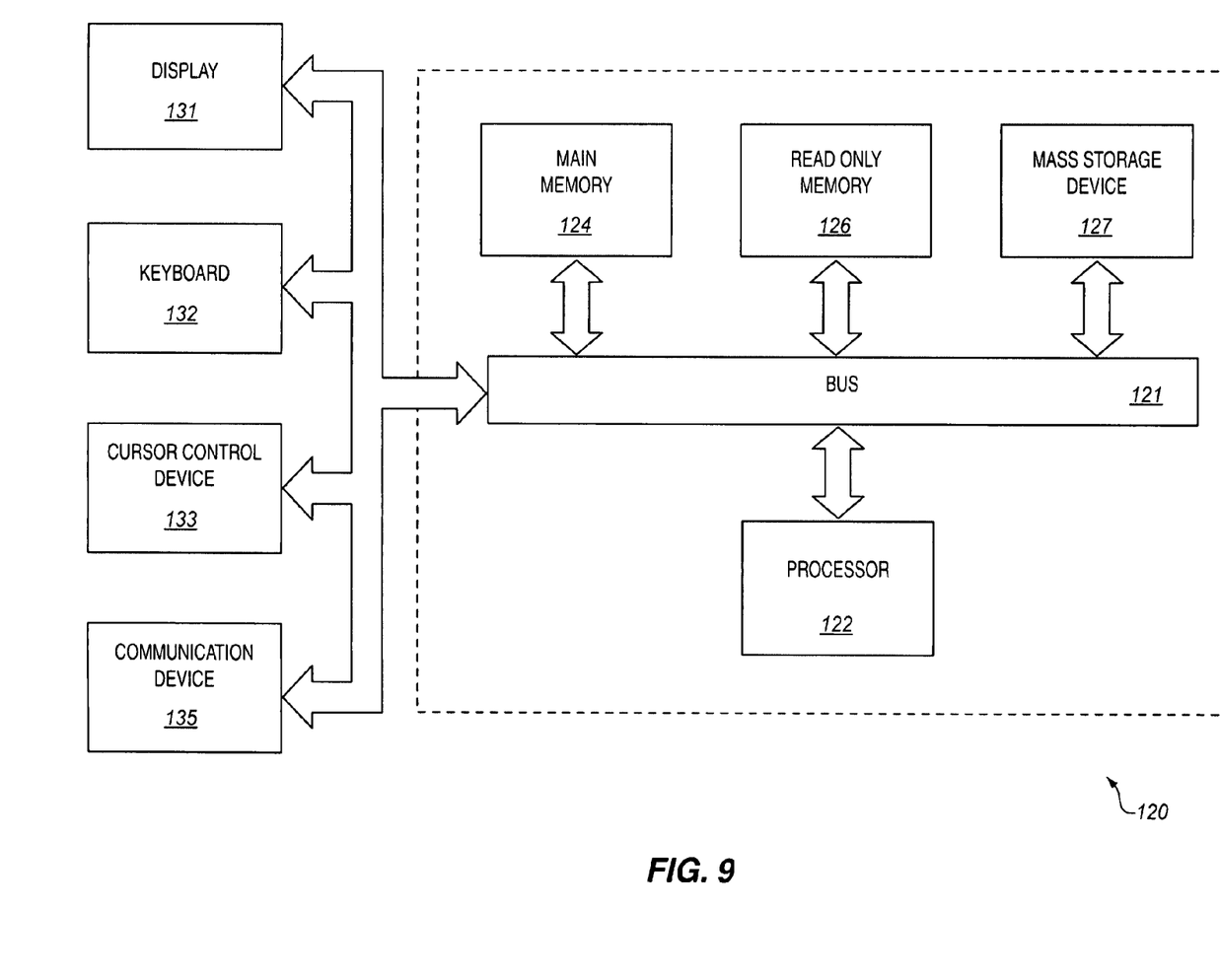
FIG. 9 is an example of a computer system capable of performing aspects of the present invention.

FIG. 9 shows a computer system 120 representing an example of a system upon which features of the present invention may be implemented. The computer system 120 includes a bus or other communication means 121 for communicating information, and a processing means such as a microprocessor 122 coupled with the bus 121 for processing information. The computer system 120 further includes a main memory 124, such as a random access memory (RAM) or other dynamic data storage device, coupled to the bus 121 for storing information and instructions to be executed by the processor 122. The main memory also may be used for storing temporary variables or other intermediate information during execution of instructions by the processor.

The computer system may also include a nonvolatile memory 126, such as a read only memory (ROM) or other static data storage device coupled to the bus for storing static information and instructions for the processor. A mass memory 127 such as a magnetic disk or optical disc and its corresponding drive may also be coupled to the bus of the computer system for storing information and instructions.

The computer system may also be coupled via the bus to a display device or monitor 131, such as a Liquid Crystal Display (LCD), for displaying information to a user. For example, graphical and textual indications of installation status, operations status and other information may be presented to the user on the display device. Typically, an alphanumeric input device 132, such as a keyboard with alphanumeric, function and other keys, may be coupled to the bus for communicating information and command selections to the processor. A cursor control input device 133, such as a mouse, a trackball, or cursor direction keys may be coupled to the bus for communicating direction information and command selections to the processor and to control cursor movement on the display 131.

A communication device 135 is also coupled to the bus 121. The communication device 135 may include a modem, a network interface card, or other well known interface devices, such as those used for coupling to Ethernet, token ring, or other types of physical attachment for purposes of providing a communication link to support a local or wide area network (LAN or WAN), for example. In this manner, the computer system may also be coupled to a number of clients or servers via a conventional network infrastructure, including an intranet or the Internet, for example.

It is to be appreciated that a lesser or more equipped computer system than the example described above may be preferred for certain implementations. Therefore, the configuration of the exemplary computer system 120 will vary from implementation to implementation depending upon numerous factors, such as price constraints, performance requirements, technological improvements, or other circumstances. Such a computer system may be used to perform simulations described above, and to generate or modify a mask as described above. In addition any of the microelectronic components of the computer system may be produced using a mask having SRAFs as described above.

Embodiments of the present invention may be provided as a computer program product which may include a machine-readable medium having stored thereon instructions which may be used to program a general purpose computer, mode distribution logic, memory controller or other electronic devices to perform a process. The machine-readable medium may include, but is not limited to, floppy diskettes, optical disks, CD-ROMs, and magneto-optical disks, ROMs, RAMs, EPROMs, EEPROMs, magnet or optical cards, flash memory, or other types of media or machine-readable medium suitable for storing electronic instructions. Moreover, embodiments of the present invention may also be downloaded as a computer program product, wherein the program may be transferred from a remote computer or controller to a requesting computer or controller by way of data signals embodied in a carrier wave or other propagation medium via a communication link (e.g., a modem or network connection).

It is to be appreciated that a lesser or more complex main feature set, mask layout, SRAF configuration, optimization process and photolithography process or system may be used than those shown and described herein. Therefore, the configurations may vary from implementation to implementation depending upon numerous factors, such as price constraints, performance requirements, technological improvements, or other circumstances. Embodiments of the invention may also be applied to other types of photolithography systems that use different materials and devices than those shown and described herein.

In the description above, numerous specific details are set forth. However, it is understood that embodiments of the invention may be practiced without these specific details. For example, well-known equivalent materials may be substituted in place of those described herein, and similarly, well-known equivalent techniques may be substituted in place of the particular processing techniques disclosed. In other instances, well-known circuits, structures and techniques have not been shown in detail to avoid obscuring the understanding of this description.

While the embodiments of the invention have been described in terms of several examples, those skilled in the art may recognize that the invention is not limited to the embodiments described, but may be practiced with modification and alteration within the spirit and scope of the appended claims. The description is thus to be regarded as illustrative instead of limiting.

What is claimed is:

1. A method comprising:
synthesizing a photolithography mask having elongated features;
applying a sub-resolution assist feature to an end-to-end gap between the elongated features;
applying trim to the ends of the sub-resolution assist feature, the trim connecting the sub-resolution assist feature to an end of a main feature, the trim having a narrower width than the remaining portion of the sub-resolution assist feature; and
modifying the synthesized photolithography mask to include the sub-resolution assist feature and trim.

2. The method of claim 1, further comprising applying optical proximity correction to the synthesized mask.

3. The method of claim 1, wherein the mask has a grating pattern of alternating lines and spaces and wherein the sub-resolution assist feature is formed along one of the lines.

4. The method of claim 1, wherein the elongated features comprise first and second line segments and wherein the end-to-end gap is between the first and second line segments.

5. The method of claim 4, wherein the first line and second line segments are centered on a centerline and the sub-resolution assist feature is centered on the same centerline.

6. The method of claim 1, wherein applying a sub-resolution assist feature comprises comparing the size of the end-to-end gap to a threshold and if the end-to-end gap is greater than a threshold, then applying the sub-resolution feature and applying the trim.

7. The method of claim 6, wherein applying a sub-resolution assist feature comprises comparing the size of the end-to-end gap to a threshold and if the end-to-end gap is less than a threshold, then applying a sub-resolution feature of a smaller width and not applying trim.

8. An apparatus comprising a machine-readable medium having instructions which when executed by a machine cause the machine to perform operations comprising:
   synthesizing a photolithography mask having elongated features;
   applying a sub-resolution assist feature to an end-to-end gap between the elongated features;
   applying trim to the ends of the sub-resolution assist feature, the trim connecting the sub-resolution assist feature to an end of a main feature, the trim having a narrower width than the remaining portion of the sub-resolution assist feature; and
   modifying the synthesized photolithography mask to include the sub-resolution assist feature and trim.

9. The medium of claim 8, wherein the instructions for applying a sub-resolution assist feature comprise instructions for comparing the size of the end-to-end gap to a threshold and if the end-to-end gap is greater than a threshold, then applying the sub-resolution feature and applying the trim.

10. The medium of claim 9, wherein the instructions for applying a sub-resolution assist feature comprise instructions for comparing the size of the end-to-end gap to a threshold and if the end-to-end gap is less than a threshold, then applying a sub-resolution feature of a smaller width and not applying trim.

11. A mask comprising:
   a first feature and a second feature separated from each other by a gap;
   a sub-resolution assist feature between the first feature and the second feature; and
   trim ends bridging the gap between the first and second features and the sub-resolution assist feature, the trim ends contacting the first and second feature and being narrower than the sub-resolution assist feature.

12. The mask of claim 11, wherein the mask has a grating pattern of alternating lines and spaces and wherein the sub-resolution assist feature and the trim ends are formed along one of the lines.

13. The mask of claim 11, wherein the elongated features comprise first and second line segments and wherein the end-to-end gap is between the first and second line segments.

14. The mask of claim 11, wherein the first line and second line segments are centered on a centerline and the sub-resolution assist feature and the trim ends are centered on the same centerline.

15. The method of claim 1, wherein the sub-resolution feature has a maximum sub-resolution width and the trim has a width less than half the width of the sub-resolution feature.

16. The method of claim 1, wherein the trim has angled sides, the sides being farthest apart where the trim meets the sub-resolution assist feature and closest together where the trim meets the main feature.

17. The method of claim 1, wherein the main feature corresponds to a transistor of a microelectronic device.

18. The method of claim 1, wherein the elongated features comprise line segments, wherein the end-to-end gap is between the line segments, wherein the line segments are centered on a centerline and, wherein the sub-resolution assist feature and the trim are centered on the same centerline.

* * * * *